US012724072B2

(12) United States Patent
Meley et al.

(10) Patent No.: US 12,724,072 B2
(45) Date of Patent: Sep. 1, 2026

(54) PROCESS FOR DETECTION OF DEGRADATION OF A SWITCHING DEVICE COMPRISING AN ELECTROMAGNETIC ACTUATOR

(71) Applicant: Schneider Electric Industries SAS, Rueil Malmaison (FR)

(72) Inventors: Jean-Pierre Meley, Saint Ismier (FR); Diana El Khoury, Grenoble (FR); Diego Alberto, Corenc (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 166 days.

(21) Appl. No.: 18/769,602

(22) Filed: Jul. 11, 2024

(65) Prior Publication Data

US 2025/0020720 A1 Jan. 16, 2025

(30) Foreign Application Priority Data

Jul. 13, 2023 (FR) ...................................... 2307588

(51) Int. Cl.
*G01R 31/327* (2006.01)

(52) U.S. Cl.
CPC ..... *G01R 31/3274* (2013.01); *G01R 31/3275* (2013.01); *G01R 31/3277* (2013.01)

(58) Field of Classification Search
CPC ............. H10D 30/4755; H10D 30/015; H10D 62/8503; H10D 64/517; H10D 62/117; H10D 62/106; H10D 62/343; H10D 64/256; H10D 30/475
See application file for complete search history.

(56) References Cited

U.S. PATENT DOCUMENTS 7,463,036 B2 12/2008 Finney et al.
7,692,522 B2 * 4/2010 Hartinger ............. H01H 1/0015 335/131
9,864,008 B2 * 1/2018 Biswas .............. G01R 31/3275
(Continued)

OTHER PUBLICATIONS

French Search Report and Written Opinion dated Mar. 7, 2024 for corresponding French Patent Application No. FR 2307588, 8 pages.

*Primary Examiner* — Lee E Rodak
*Assistant Examiner* — Zannatul Ferdous
(74) *Attorney, Agent, or Firm* — FIG. 1 Patents

(57) ABSTRACT

A process for detecting degradation of a switching device including an electromagnetic actuator configured to unlock a control mechanism including an elastic member. The process includes: (i) commanding the electromagnetic actuator, (ii) measuring an electrical current circulating in the electromagnetic actuator, (iii) determining from the measured electrical current a reaction time of the electromagnetic actuator, (iv) determining from the measured electrical current a quantity representative of the current circulating in the electromagnetic actuator, (v) determining a parameter in the form of a polynomial of the determined reaction time and of the determined quantity representative of the current circulating in the electromagnetic actuator, (vi) iterating the steps (i) to (v) for a set of successive commands of the electromagnetic actuator so as to obtain a set of values of the predetermined parameter, (vii) determining a degradation of the electromagnetic actuator from the evolution of the values of the set in the course of the successive commands of the electromagnetic actuator.

20 Claims, 6 Drawing Sheets

(56) References Cited

U.S. PATENT DOCUMENTS

| | | | | |
|---|---|---|---|---|
| 2005/0047045 | A1* | 3/2005 | Puskar .................. | H02H 3/006 361/115 |
| 2009/0154046 | A1* | 6/2009 | Robinson .............. | H01H 71/74 361/95 |
| 2017/0287666 | A1 | 10/2017 | Tanigaki et al. | |
| 2020/0072893 | A1 | 3/2020 | Madane et al. | |
| 2023/0025832 | A1 | 1/2023 | Alberto et al. | |

* cited by examiner

PROCESS FOR DETECTION OF DEGRADATION OF A SWITCHING DEVICE COMPRISING AN ELECTROMAGNETIC ACTUATOR

TECHNICAL FIELD

The present invention relates to the field of switching devices for electrical equipment, for example for low- and medium-voltage electrical equipment. The switching device may for example be a circuit breaker.

PRIOR ART

A low- or medium-voltage switching device may comprise one or more electromagnetic actuators making it possible to unlock a spring-loaded control mechanism, making it possible to move a mobile electrical contact, so as to open or close an electrical circuit. In the case of a circuit breaker, the electrical circuit is opened in the event of the appearance of a fault in the electrical circuit. The fault may notably be a short circuit between two phases, or between a phase and earth. Closing the circuit makes it possible to power up a load.

The electromagnetic actuator comprises a mobile magnetic core and a control coil. Under the action of an electrical current running through the control coil, the magnetic core moves. The magnetic core is mechanically coupled to the control mechanism acting on the mobile electrical contacts so as to be able to open or close the electrical circuit.

In order to ensure the safety of the electrical network and of people, it is important to be able to check whether the switching devices are operating correctly throughout their lifetime. For this purpose, the circuit breakers may comprise measurement circuits making it possible to diagnose the condition of the electromagnetic actuator in real time. This electromagnetic actuator is generally subjected to the effects of ageing, which may gradually degrade its electrical or mechanical functions, and eventually render it inoperative. It is therefore important for users to be able to follow the evolution of the condition of the electromagnetic actuator. It is desirable to make it possible for users to intervene to repair or change the electromagnetic actuator at an opportune moment in the management of the electrical network.

SUMMARY

To this end, the invention proposes a process for detecting degradation of a switching device comprising an electromagnetic actuator configured to unlock a control mechanism comprising an elastic member configured to move a mobile electrical contact so as to open or close an electrical circuit, the process comprising the steps:

(i) commanding the electromagnetic actuator, (ii) measuring an electrical current circulating in the electromagnetic actuator during the command of the electromagnetic actuator, (iii) determining from the measured electrical current a reaction time of the electromagnetic actuator, (iv) determining from the measured electrical current a quantity representative of the current circulating in the electromagnetic actuator during the command of the electromagnetic actuator, (v) determining a parameter in the form of a polynomial of the determined reaction time and of the determined quantity representative of the current circulating in the electromagnetic actuator during the command of the electromagnetic actuator, (vi) iterating the steps (i) to (v) for a set of successive commands of the electromagnetic actuator so as to obtain a set of values of the predetermined parameter, (vii) determining a degradation of the electromagnetic actuator from the evolution of the values of the set in the course of the successive commands of the electromagnetic actuator.

The process for detecting degradation of the switching device is a process making it possible to detect an evolution of the behaviour of the switching device because of the ageing of its components.

The ageing of the components comprises, for example, wear, deformations, the effect of corrosion, the evolution of the magnetic performance, the evolution of the tribological properties of the components.

In the case where the electromagnetic actuator is operating nominally, the values of the set substantially do not evolve in the course of the successive actuations. In other words, the various values of the set are substantially constant. Conversely, a gradual degradation of the electromagnetic actuator has a tendency to cause an evolution of the values in the course of the successive actuations, in particular a fluctuation of these values. The values of the set are no longer substantially constant and exhibit significant fluctuation. This gradual evolution makes it possible to detect degradation of the magnetic actuator of the switching device.

The process for detecting degradation of the switching device is a process also making it possible to anticipate the appearance of a fault of the switching device.

Specifically, an uncorrected degradation of the switching device may eventually lead to the appearance of a fault.

The features listed in the following paragraphs may be implemented independently of one another or in any technically possible combination:

In step (vii), the evolution of the values of the set may be a fluctuation of the values of the set in the course of the successive commands of the electromagnetic actuator.

The set of values of the polynomial of the determined reaction time and of the determined quantity is obtained by a succession of consecutive commands of the electromagnetic actuator of the switching device.

Each value of the set of values of the polynomial of the determined reaction time and of the determined quantity corresponds to a distinct actuation of the electromagnetic actuator of the switching device.

The switching device may be a circuit breaker.

As a variant, the switching device may be a switch.

According to another variant, the switching device may be a disconnector.

The switching device comprises:

- an electrical contact which is mobile between a position for opening an electrical circuit and a position for closing the electrical circuit,
- a control mechanism comprising:
  - an elastic member configured to move the electrical contact from the closing position to the opening position or from the opening position to the closing position, so as to open or close the electrical circuit, respectively,
  - an unlocking member configured to pass from a locking position in which the elastic member is kept in a state of tension to a freeing position in which the elastic member is free to relax so as to move the electrical contact from the closing position to the opening position or from the opening position to the closing position, an electromagnetic actuator configured to move the unlocking member from the locking position to the freeing position.

According to one embodiment, referred to as the first embodiment:

the elastic member is configured to move the electrical contact from the closing position to the opening position so as to open the electrical circuit, and the unlocking member is configured to pass from a locking position in which the elastic member is kept in a state of tension to a freeing position in which the elastic member is free to relax so as to move the electrical contact from the closing position to the opening position.

According to another embodiment, referred to as the second embodiment:

the elastic member is configured to move the electrical contact from the opening position to the closing position, so as to close the electrical circuit, the unlocking member is configured to pass from a locking position in which the elastic member is kept in a state of tension to a freeing position in which the elastic member is free to relax so as to move the electrical contact from the opening position to the closing position.

The elastic member is configured to apply a driving force to the mobile electrical contact.

The elastic member is connected to a driving element configured to move the mobile electrical contact so as to open or close an electrical circuit.

The driving element comprises for example a connecting rod.

According to the first embodiment, the unlocking member may pass from a locking position in which the elastic member of the control mechanism is elastically stressed and in which the mobile electrical contact is in the position for closing the electrical circuit, to an unlocked position in which the elastic member of the control mechanism is freed and moves the mobile electrical contact from the position for closing the electrical circuit to a position for opening the electrical circuit.

According to the second embodiment, the unlocking member may pass from a locking position in which the elastic member of the control mechanism is elastically stressed and in which the mobile electrical contact is in the position for opening the electrical circuit, to an unlocked position in which the elastic member of the control mechanism is freed and moves the mobile electrical contact from a position for opening the electrical circuit to the position for closing the electrical circuit.

What is meant by "unlock the control mechanism" is the fact of freeing the elastic member of the control mechanism. In other words, unlocking the control mechanism is equivalent to moving the unlocking member from the locking position to the freeing position.

The electromagnetic actuator is an electromagnet.

The electromagnetic actuator comprises a control coil and a magnetic core configured to move under the action of a magnetic field created by a circulation of electrical current in the control coil.

The magnetic core is for example translatable.

The magnetic core is mechanically coupled to an unlocking member configured to pass from a locking position in which the elastic member is kept in a state of tension to a freeing position in which the elastic member is free to relax so as to move the electrical contact from the closing position to the opening position.

What is meant by "measuring an electrical current circulating in the electromagnetic actuator" is the fact of measuring the intensity of the electrical current circulating in the electromagnetic actuator.

The electrical current circulating in the electromagnetic actuator is detected by an electronic measurement circuit.

The electrical current circulating in the electromagnetic actuator is sampled, for example with a sampling frequency comprised between 1 kHz and 100 KHz.

The electromagnetic actuator comprises a coupling element mechanically coupling the magnetic core to the unlocking member.

The control mechanism may comprise rotatable elements.

The control mechanism may comprise translatable elements.

The elastic member may be a spring, for example a spiral spring or a helical spring.

The electromagnetic actuator is configured to trigger a movement of the mobile electrical contact in order to open the electrical circuit.

When the switching device is a circuit breaker, the electromagnetic actuator is configured to trigger an opening of the electrical circuit in the event of the presence of a fault on the electrical circuit.

According to one aspect of the proposed detection process, the reaction time of the electromagnetic actuator is determined from the temporal variations in the measured electrical current.

The proposed process thus does not require the installation of any additional sensor, such as a sensor of the movement of the electrical contact or a sensor of the movement of an element of the control mechanism.

The proposed process comprises a substep of determining the temporal variations in the measured electrical current.

According to one example of an implementation of the detection process, the reaction time of the electromagnetic actuator is equal to a time elapsed between an instant at which the electrical current starts to circulate in the electromagnetic actuator and an instant corresponding to a local minimum value of the electrical current circulating in the electromagnetic actuator.

According to one embodiment of the detection process, the quantity representative of the current circulating in the electromagnetic actuator during the actuation of the switching device is a local maximum value of the electrical current circulating in the electromagnetic actuator.

In step (v), the parameter is determined by a polynomial with two indeterminates, that is to say a sum of monomials with two indeterminates. A first indeterminate is the determined reaction time, and the second indeterminate is the determined quantity representative of the current circulating in the electromagnetic actuator during the command of the electromagnetic actuator.

Each monomial of the polynomial is thus determined by the product: of the determined reaction time, raised to a given first power, of the determined quantity representative of the current circulating in the electromagnetic actuator during the command of the electromagnetic actuator, raised to a given second power, and of a constant coefficient.

Each monomial may be written in the form:

$$A_i * (ta)^{k_i} * (i1)^{L_i} \quad \text{[Math. 2]}$$

The polynomial forming the parameter P may thus be written:

$$P = \sum_{i=0}^{H} A_i * (ta)^{k_i} * (i1)^{L_i} \quad \text{[Math. 3]}$$

with the coefficients $k_0, \ldots, K_H$ taking rational values, the coefficients $L_0, \ldots, L_H$ taking rational values, and the coefficients $A_i$ taking rational values.

Among a multitude of studied parameters, the applicant concluded that the polynomial formed from the reaction time of the electromagnetic actuator and from the local maximum value of the circuit electrical current in the electromagnetic actuator best accounts for a gradual degradation of this electromagnetic actuator. The polynomial is thus a polynomial with two indeterminates.

According to one particular embodiment of the proposed detection process, the parameter P is equal to the product of the determined reaction time and of the determined quantity representative of the current circulating in the electromagnetic actuator during the command of the electromagnetic actuator.

In other words, in this particular case of implementation of the process, the polynomial comprises a single term, in other words is a monomial. The first power of the monomial is equal to 1 and the second power of the monomial is also equal to 1. The formed monomial is then equal to the product of the determined reaction time and of the determined quantity representative of the current circulating in the electromagnetic actuator during the command of the electromagnetic actuator, that is to say to the result of the multiplication of the value of the determined reaction time by the value of the determined quantity representative of the current circulating in the electromagnetic actuator during the command of the electromagnetic actuator.

The local maximum value of the current is obtained for an instant between an instant at which the electrical current starts to circulate in the electromagnetic actuator and an instant corresponding to a local minimum of the electrical current circulating in the electromagnetic actuator.

According to one embodiment, the detection process comprises the substeps:

- calculating a value of a statistical parameter representative of a fluctuation of the values of the set of values of the polynomial of the determined reaction time and of the determined quantity,
- determining a degradation of the electromagnetic actuator from the calculated value of the statistical parameter.

According to one example of an implementation of the detection process, the statistical parameter representative of a fluctuation of the values of the set of values of the polynomial of the determined reaction time and of the determined quantity comprises a difference between:

- a current value of the polynomial of the determined reaction time and of the determined quantity, determined for a current actuation of the switching device, and
- an average value of the values of the polynomial of the determined reaction time and of the determined quantity obtained for a predetermined number of actuations preceding the current actuation of the switching device.

The average value may be a running average calculated from the values corresponding to the actuations preceding the current actuation, and comprising a number of values equal to the predetermined number of actuations.

According to one example of an implementation of the detection process, the statistical parameter representative of a fluctuation of the values of the set of values of the polynomial of the determined reaction time and of the determined quantity comprises a standard deviation of the values of the polynomial of the determined reaction time and of the determined quantity determined for a set of actuations of the switching device carried out in reference conditions corresponding to a new condition of the switching device.

The set of actuations of the switching device carried out in reference conditions comprises for example 20 successive actuations of the switching device.

The proposed process thus comprises a calibration phase making it possible to quantify the nominal variations in the value of the polynomial of the determined reaction time and of the quantity representative of the current circulating in the electromagnetic actuator during the actuation of the switching device. These nominal variations correspond to the variations observed in a reference state in which the switching device exhibits neither a manufacturing defect nor wear.

The reference state corresponds for example to a new condition of the switching device.

The proposed process comprises a measurement phase in which the variations in the value of the polynomial of the determined reaction time and of the quantity representative of the current circulating in the electromagnetic actuator are analysed.

The measurement phase follows the calibration phase.

The measurement phase is carried out throughout the useful life of the switching device.

According to one embodiment of the detection process, the statistical parameter representative of a fluctuation of the polynomial of the determined reaction time and of the determined quantity is equal to the ratio of:

- the difference between a current value of the polynomial determined for a current actuation and the average value of the values of the polynomial obtained for a predetermined number of actuations preceding the current actuation, and
- the determined standard deviation of the values of the polynomial of the determined reaction time and of the determined quantity, determined for a set of actuations of the switching device carried out in reference conditions corresponding to a new condition of the switching device.

The proposed statistical parameter makes robust detection of possible degradation of the electromagnetic actuator possible, while at the same time being simple to implement. In particular, the necessary calculations may easily be carried out in real time, which makes rapid detection of possible degradation possible.

According to one embodiment of the detection process, the statistical parameter representative of a fluctuation of the polynomial of the determined reaction time and of the determined quantity is equal to:

$$D_i = \frac{P_i - \frac{\sum_{j=i-M-1}^{j=i-1} P_j}{M}}{\sqrt{\sum_{j=1}^{K}\left(\frac{P_j - \frac{\sum_{j=1}^{j=K} P_j}{K}}{K}\right)^2}} \quad \text{[Math. 1]}$$

with $P_i$ being the determined value of the polynomial for an actuation of rank i, $D_i$ the calculated value of the statistical parameter for the actuation of rank i, M a number of actuations taken into account in order to determine an average value, K a number of actuations carried out in reference conditions corresponding to a new condition of the switching device.

According to one example of an implementation of the detection process, a degradation of the electromagnetic actuator is determined when the absolute value of the statistical parameter representative of a fluctuation of the polynomial of the determined reaction time and of the determined quantity is above a first positive predetermined threshold.

The value chosen for the first positive predetermined threshold makes it possible to adjust the sensitivity of the proposed detection process.

The first positive predetermined threshold is for example between 2 and 3.

Conversely, an absence of degradation of the electromagnetic actuator is determined when the absolute value of the statistical parameter representative of a fluctuation of the polynomial of the determined reaction time and of the determined quantity is below or equal to the first positive predetermined threshold.

In other words, a degradation is determined when the absolute value of the statistical parameter takes a value above a predefined threshold value. Conversely, an absence of degradation is determined when the absolute value of the statistical parameter takes a value below the predefined threshold value.

According to one example of an embodiment of the detection process, the degradation of the electromagnetic actuator is classified as a first type of degradation, referred to as minor degradation, when the absolute value of the statistical parameter representative of a fluctuation of the polynomial of the determined reaction time and of the determined quantity is above a first positive predetermined threshold and below a second positive predetermined threshold.

The second positive predetermined threshold is for example between 4 and 5.

According to one example of an embodiment of the detection process, the degradation of the electromagnetic actuator is classified as a second type of degradation, referred to as major degradation, when the absolute value of the statistical parameter representative of a fluctuation of the polynomial of the determined reaction time and of the determined quantity is above the second positive predetermined threshold.

The used statistical parameter thus makes it possible to quantify the severity of the degradation, and not only the presence or the absence of degradation.

The detection process may comprise a step of transmitting an alarm signal in response to a determination of a degradation of the electromagnetic actuator.

The transmitted alarm signal makes it possible for users to plan and to carry out an operation of maintaining or of replacing the switching device when the latter is in a degraded, or even defective, condition.

No alarm signal is transmitted when no degradation has been determined. In other words, no alarm is transmitted when the proposed process indicates that the electromagnetic actuator is free from degradation.

The invention also relates to a switching device comprising:

- an electromagnetic actuator configured to unlock a control mechanism comprising an elastic member configured to move an electrical contact so as to open or close an electrical circuit,
- an electronic control unit configured to implement the process for detecting degradation as described above.

According to one embodiment, the switching device comprises:

- a control circuit configured to make an electrical current circulate in the electromagnetic actuator,
- a sensor for measuring the current circulating in the electromagnetic actuator.

BRIEF DESCRIPTION OF THE DRAWINGS

Further features, details and advantages will become apparent from reading the detailed description below and from analysing the appended drawings, in which.

DESCRIPTION OF THE EMBODIMENTS

In order to make the figures easier to read, the various elements are not necessarily depicted to scale. In these figures, identical elements bear the same reference signs. Certain elements or parameters may be indexed, that is to say designated for example as the first element or the second element, or indeed the first parameter and the second parameter, etc. The aim of this indexing is to differentiate between elements or parameters which are similar but not identical. This indexing does not imply the priority of one element or parameter with respect to another, and the denominations may be interchanged. When it is specified that a subsystem comprises a given element, this does not exclude the presence of other elements in that subsystem. Likewise, when it is specified that a subsystem comprises a given element, it is understood that the subsystem comprises at least this element.

Figure 1:
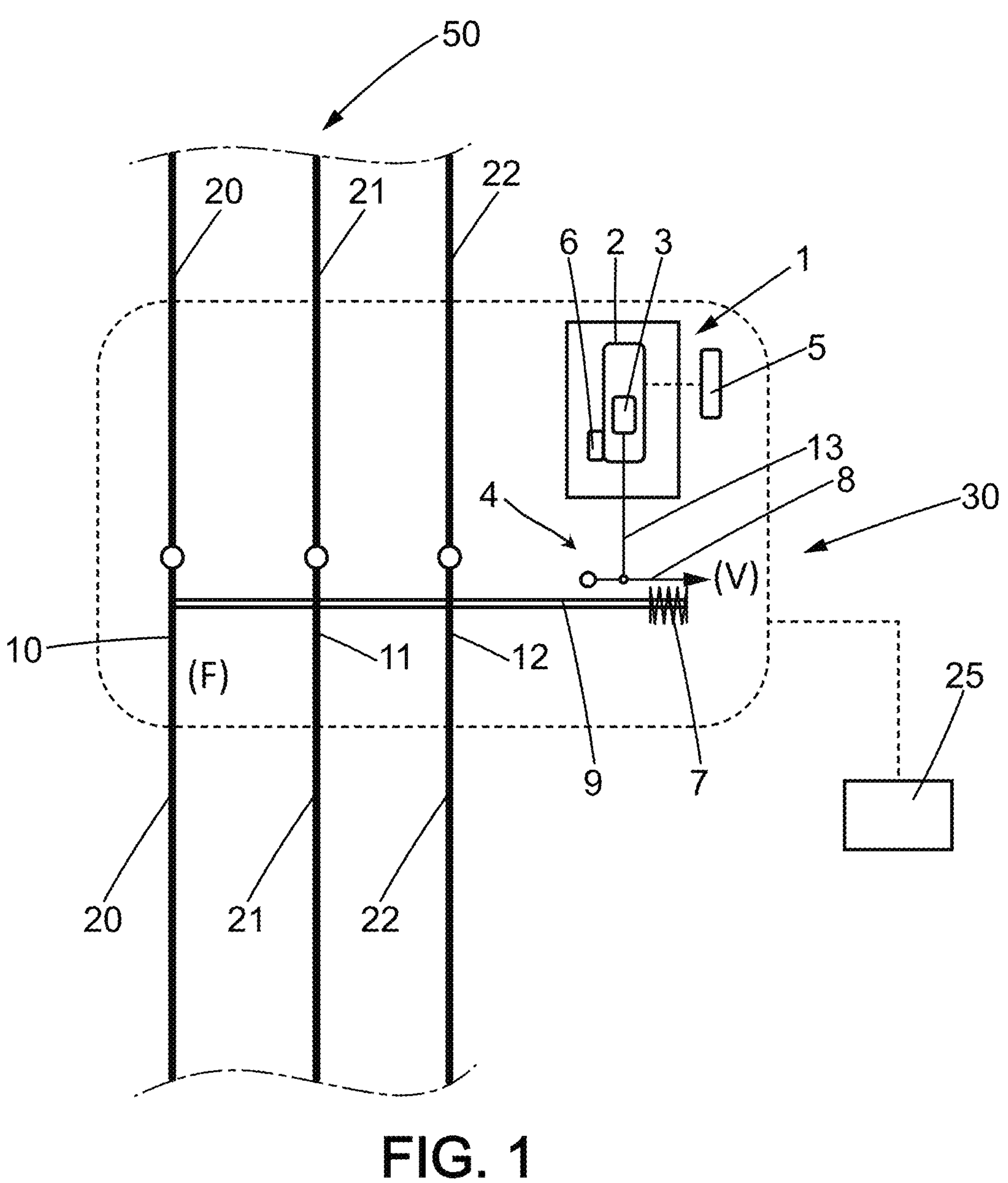
FIG. 1 is a schematic view of an electrical circuit equipped with a switching device, the electrical circuit being in the open position.

FIG. 1 schematically depicts an electrical circuit 50. The electrical circuit 50 comprises three electrical conductors 20, 21, 22, each conductor corresponding to a phase of a medium-voltage three-phase network.

The electrical circuit 50 comprises a switching device 30. The switching device 30 may be a circuit breaker.

According to one variant, the switching device 30 may be a switch.

According to another example of an application, the switching device 30 may be a disconnector.

The switching device 30 comprises:

- an electromagnetic actuator 1 configured to unlock a control mechanism 4 comprising an elastic member 7 configured to move a mobile electrical contact 10 so as to open or close an electrical circuit 50,
- an electronic control unit 25 configured to implement the process for detecting degradation which will be described in detail below.

The electromagnetic actuator 1 is an electromagnet.

The electromagnetic actuator 1 comprises a control coil 2 and a magnetic core 3 configured to move under the action of a magnetic field created by a circulation of electrical current in the control coil 2.

The magnetic core 3 is for example translatable.

The magnetic core 3 is mechanically coupled to an unlocking member 8 configured to pass from a locking position V in which the elastic member 7 is kept in a state of tension to a freeing position L in which the elastic member 7 is free to relax so as to move the electrical contact 10 from the closing position F to the opening position O.

The mobile electrical contact 10 is associated with the electrical conductor 20. In the same way, a mobile electrical contact 11 is associated with the electrical conductor 21, and a mobile electrical contact 12 is associated with the electrical conductor 22. In FIG. 1, the mobile electrical contact 10 is depicted in the open position, that is to say in the position where the circulation of the electrical current in the electrical circuit 50 is interrupted.

Figure 2:
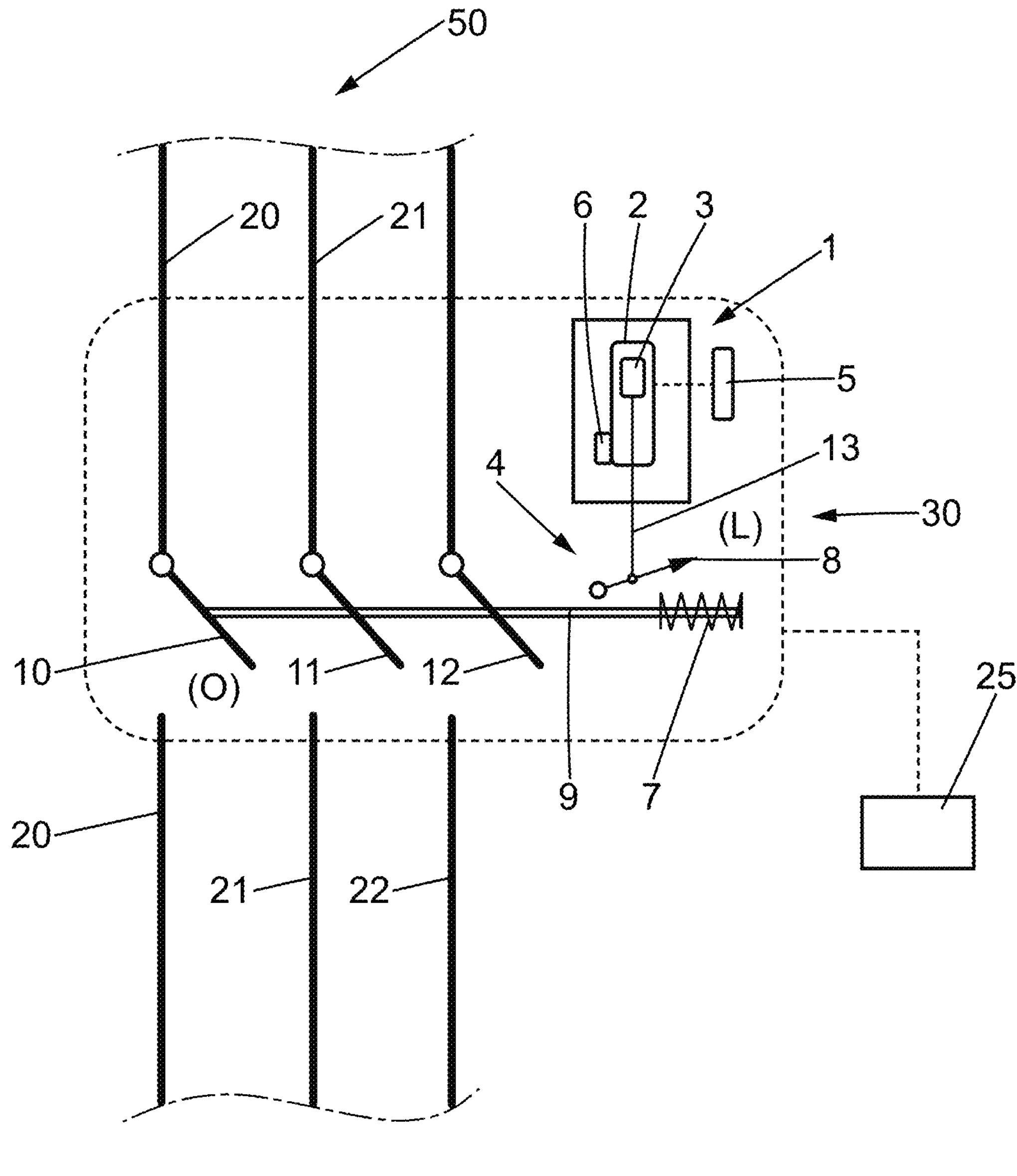
FIG. 2 is a schematic view of an electrical circuit equipped with a switching device, the electrical circuit being in the closed position.

In FIG. 2, the mobile electrical contact 10 is depicted in the closed position, that is to say in the position where the circulation of the electrical current in the electrical circuit 50 is possible.

The electromagnetic actuator 1 comprises a coupling element 13 mechanically coupling the magnetic core 3 to the unlocking member 8.

The control mechanism 4 may comprise rotatable elements.

The control mechanism 4 may comprise translatable elements.

The control mechanism 4 may move the three mobile electrical contacts 10, 11, 12 jointly.

The electromagnetic actuator 1 is configured to trigger a movement of the mobile electrical contact 10 in order to open the electrical circuit 50.

When the switching device 30 is a circuit breaker, the electromagnetic actuator 1 is configured to trigger an opening of the electrical circuit 50 in the event of the presence of a fault on the electrical circuit 50.

One example of a fault which may be present on the electrical circuit 50 is a short circuit between two distinct phases. Another type of fault may be a short circuit between a phase and earth.

The switching device 30 comprises:

- an electrical contact 10 which is mobile between a position O for opening an electrical circuit 50 and a position F for closing the electrical circuit 50,
- a control mechanism 4 comprising:
  - an elastic member 7 configured to move the electrical contact 10 from the closing position F to the opening position O or from the opening position O to the closing position F, so as to open or close the electrical circuit 50, respectively,
  - an unlocking member 8 configured to pass from a locking position V in which the elastic member 7 is kept in a state of tension to a freeing position L in which the elastic member 7 is free to relax so as to move the electrical contact 10 from the closing position F to the opening position O or from the opening position O to the closing position F,
- an electromagnetic actuator 1 configured to move the unlocking member 8 from the locking position V to the freeing position L.

According to the embodiment illustrated in FIG. 1 and FIG. 2:

- the elastic member 7 is configured to move the electrical contact 10 from the closing position F to the opening position O so as to open the electrical circuit 50, and
- the unlocking member 8 is configured to pass from a locking position V in which the elastic member 7 is kept in a state of tension to a freeing position L in which the elastic member 7 is free to relax so as to move the electrical contact 10 from the closing position F to the opening position O.

In other words, the control mechanism 4 makes it possible to cut off the circulation of the electrical current in the electrical circuit 50.

According to another embodiment, which is not depicted:

- the elastic member 7 is configured to move the electrical contact 10 from the opening position O to the closing position F, so as to close the electrical circuit 50,
- the unlocking member 8 is configured to pass from a locking position V in which the elastic member 7 is kept in a state of tension to a freeing position L in which the elastic member 7 is free to relax so as to move the electrical contact 10 from the opening position O to the closing position F.

In other words, the control mechanism 4 in this case makes it possible to establish the circulation of the electrical current in the electrical circuit 50.

The elastic member 7 is configured to apply a driving force to the mobile electrical contact 10.

The elastic member 7 may be a spring, for example a spiral spring or a helical spring.

The elastic member 7 is connected to a driving element 9 configured to move the mobile electrical contact 10 so as to open or close an electrical circuit 50.

The driving element 9 comprises for example a connecting rod.

According to the embodiment illustrated in FIG. 1 and FIG. 2, the unlocking member 8 may pass from a locking position in which the elastic member 7 of the control mechanism 4 is elastically stressed and in which the mobile electrical contact 10 is in the position F for closing the electrical circuit 50, to

- an unlocked position V in which the elastic member 7 of the control mechanism 4 is freed and moves the mobile electrical contact 10 from the position F for closing the electrical circuit 50 to a position O for opening the electrical circuit 50.

According to the second embodiment, which is not illustrated, the unlocking member 8 may pass from a locking position in which the elastic member 7 of the control mechanism 4 is elastically stressed and in which the mobile electrical contact 10 is in the position O for opening the electrical circuit 50, to an unlocked position V in which the elastic member 7 of the control mechanism 4 is freed and moves the mobile electrical contact 10 from a position O for opening the electrical circuit 50 to the position F for closing the electrical circuit 50.

What is meant by "unlock the control mechanism 4" is the fact of freeing the elastic member 7 of the control mechanism 4.

The electromagnet 1 makes it possible to command the movement of the unlocking member 8 so as to free the elastic member 7.

The propulsive force making it possible to move the mobile electrical contact 10 is provided by the elastic member 7. The electromagnetic actuator 1 has no direct interaction with the mobile electrical contact 10. The electromagnetic actuator 1 provides a force of electromagnetic origin making the movement of the unlocking member 8, by means of the coupling element 13, possible. Once the unlocking member 8 is in the unlocked position V, the potential energy stored by the elastic member 7 is freed and moves the electrical contact 10 by means of the driving element In FIG. 1, the unlocking member 8 is in the locking position V and the elastic member 7, which is schematically depicted as a helical spring, is kept in the compressed state. The mobile contact 10 is in the closed position, corresponding to a circulation of the electrical current in the electrical conductor 20.

In FIG. 2, the coupling element 13 has moved the unlocking member 8 into a freeing position. The elastic member 7 is in the relaxed state, and the driving element 9 has moved the mobile electrical contact 10 into its opening position, corresponding to an interruption of the flow of the electrical current in the electrical conductor 20 and therefore in the electrical circuit 50.

The mechanical components of the switching device 30 may degrade in the course of the useful lifetime of the switching device, notably because of the wear resulting from the repetition of the triggerings, the deformations and the chemical corrosion which may occur.

It is therefore desirable to be able to have a process, or method, for diagnosing the switching device 30, that is to say a process, or method, making it possible to detect the appearance of a degradation of the switching device 30.

A process, or method, is thus proposed for detecting degradation of a switching device 30 comprising an electromagnetic actuator 1 configured to unlock a control mechanism 4 comprising an elastic member 7 configured to move a mobile electrical contact 10 so as to open or close an electrical circuit 50, the process comprising the steps:

(i) commanding the electromagnetic actuator 1, (ii) measuring an electrical current C circulating in the electromagnetic actuator 1 during the command of the electromagnetic actuator 1, (iii) determining from the measured electrical current C a reaction time ta of the electromagnetic actuator 1, (iv) determining from the measured electrical current C a quantity i1 representative of the current circulating in the electromagnetic actuator 1 during the command of the electromagnetic actuator 1, (v) determining a parameter P in the form of a polynomial of the determined reaction time ta and of the determined quantity i1 representative of the current circulating in the electromagnetic actuator 1 during the command of the electromagnetic actuator 1, (vi) iterating the steps (i) to (v) for a set of successive commands of the electromagnetic actuator 1 so as to obtain a set E of values of the predetermined parameter P, (vii) determining a degradation of the electromagnetic actuator 1 from the evolution of the values of the set E in the course of the successive commands of the electromagnetic actuator 1.

In the case where the electromagnetic actuator 1 is operating nominally, the values of the set E substantially do not evolve in the course of the successive actuations. In other words, the various values of the set E are substantially constant. Conversely, a gradual degradation of the electromagnetic actuator 1 has a tendency to cause an evolution of the values of the set E in the course of the successive actuations. The values of the set E are no longer substantially constant and exhibit significant fluctuation. This gradual evolution makes it possible to detect degradation of the switching device 30, as well as the presence of a fault.

The set E of values of the polynomial P of the determined reaction time ta and of the determined quantity i1 is obtained by a succession of consecutive commands of the electromagnetic actuator 1 of the switching device 30.

Each value of the set E of values of the polynomial P of the determined reaction time ta and of the determined quantity i1 corresponds to a distinct actuation of the electromagnetic actuator 1 of the switching device 30.

In other terms, a value of the reaction time ta is associated with each of the various actuations of the switching device 30. In the same way, a value of the predetermined parameter i1 is associated with each of the various actuations of the switching device 30. A value of the polynomial P of ta and i1 is associated with each of the actuations of the switching device 30.

The switching device 30 comprises:

a control circuit 5 configured to make an electrical current circulate in the electromagnetic actuator 1, a sensor 6 for measuring the current circulating in the electromagnetic actuator 1.

What is meant by "measuring an electrical current C circulating in the electromagnetic actuator 1" is the fact of measuring the intensity of the electrical current circulating in the electromagnetic actuator 1.

More specifically, the intensity of the electrical current circulating in the control coil 2 is measured.

For this purpose, the electrical current C circulating in the electromagnetic actuator 1 is detected by an electronic measurement circuit.

In the illustrated example, the electrical current C circulating in the electromagnetic actuator 1 is sampled, for example with a sampling frequency comprised between 1 KHz and 100 KHz.

In other words, the value of the current is measured periodically during a phase of actuation of the electromagnetic actuator 1.

The reaction time ta of the electromagnetic actuator 1 is determined from the temporal variations in the measured electrical current C.

The proposed process thus comprises a substep of determining the temporal variations in the measured electrical current C.

No sensor other than the sensor for measuring the current is necessary for determining the reaction time ta of the electromagnetic actuator 1. In particular, it is not necessary to have a sensor of the movement of an element of the control mechanism 4 connecting the mobile electrical contact 10 to the electromagnetic actuator 1.

According to one aspect of the proposed detection process, the reaction time ta of the electromagnetic actuator 1 is equal to a time elapsed between an instant to at which the electrical current starts to circulate in the electromagnetic actuator 1 and an instant tmin corresponding to a local minimum value of the electrical current circulating in the electromagnetic actuator 1.

Figure 3:
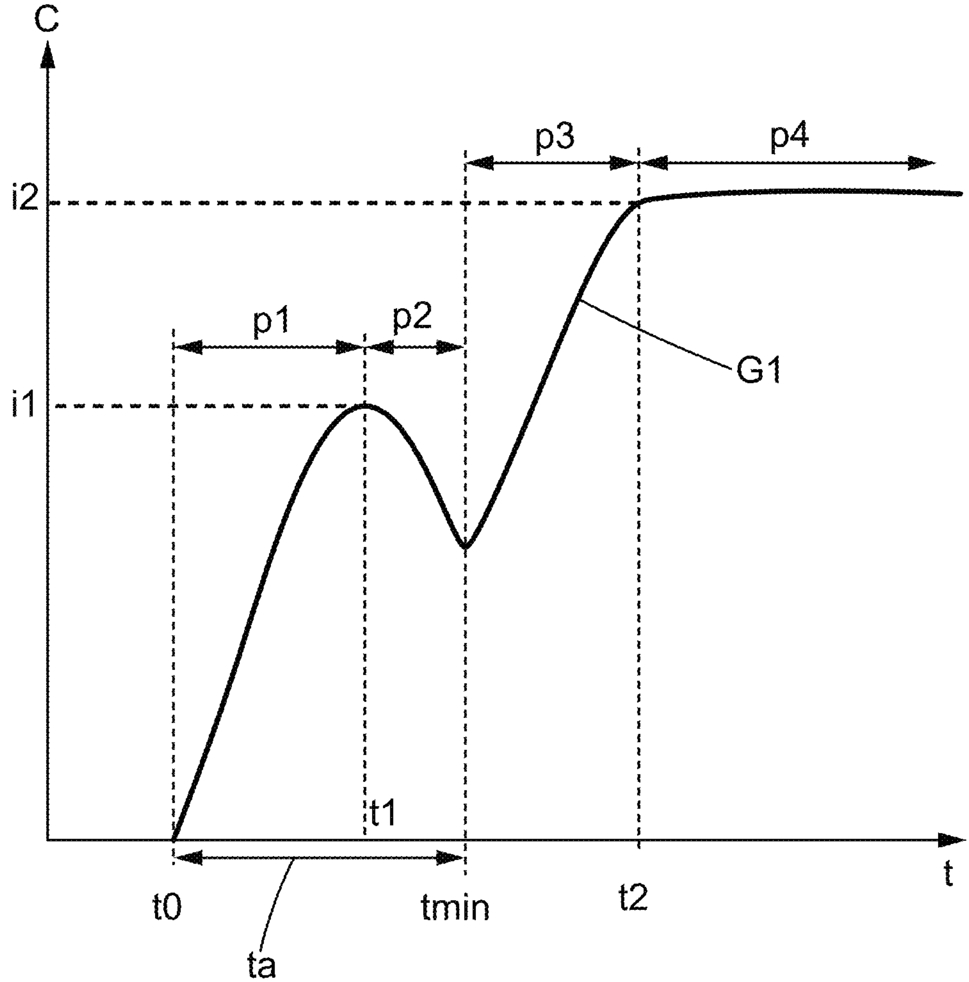
FIG. 3 is a curve of the temporal evolution of the current in an electromagnetic actuator of a switching device, during the actuation of the latter.

FIG. 3 schematically depicts a curve of the temporal evolution of the electrical current circulating in the electromagnetic actuator 1 when the latter is commanded. This curve of intensity as a function of time is designated by the reference sign G1.

The curve G1 of the temporal evolution of the electrical current in the electromagnetic actuator 1 comprises a first, continuously increasing portion p1, a second, continuously decreasing portion p2, the second portion p2 following the first portion p1, a third, continuously increasing portion p3, the third portion p3 following the second portion p2. The instant tmin corresponding to the local minimum of the current corresponds to the instant separating the third portion p3 from the second portion p2. The instant to at which the electrical current starts to circulate in the electromagnetic actuator 1 corresponds to the start of the continuously increasing portion p1.

The first portion p1 comprises a first part in which the current increases linearly. Then, as it approaches the instant t1, the increase of the current becomes less rapid. At the instant t1 the current reaches its maximum value since the instant to, then the current decreases. This decrease of the current is connected to the evolution of the gap between the mobile parts and the fixed parts.

The current decreases until the instant tmin, when it reaches its minimum value since the instant t1, then reincreases.

The instant tmin corresponds to the end of the phase of movement of the magnetic core 3.

Once the gap is no longer evolving, the current begins to increase again, which corresponds to the portion p3 of the curve G1.

The curve of the temporal evolution of the electrical current in the electromagnetic actuator 1 comprises a fourth, substantially constant portion p4, the fourth portion p4 following the third portion p3.

The permanent electrical current is established, from the instant indicated by t2, at a permanent value i2.

The drop in the current when the command of the coil 2 is interrupted is not illustrated in FIG. 3.

According to one embodiment of the detection process, the quantity i1 representative of the current circulating in the electromagnetic actuator 1 during the actuation of the switching device 30 is a local maximum value of the electrical current circulating in the electromagnetic actuator 1.

The parameter i1 corresponds to the maximum value of the current in the course of the command phase during which the magnetic core 3 is in motion, which extends between the instant t0 and the instant tmin.

In step (v), the parameter P is determined by a sum of monomials with two indeterminates. A first indeterminate is the determined reaction time ta, and the second indeterminate is the determined quantity i1 representative of the current circulating in the electromagnetic actuator 1 during the command of the electromagnetic actuator 1.

Thus:

$$P = \sum_{i=0}^{H} M_i \quad \text{[Math. 4]}$$

Each monomial $M_i$ of the polynomial is thus determined by the product: of the determined reaction time ta, raised to a given first power $K_i$, and: of the determined quantity i1 representative of the current circulating in the electromagnetic actuator 1 during the command of the electromagnetic actuator 1, raised to a given second power $L_i$, and of a constant coefficient $A_i$.

Each monomial $M_i$ may be written in the form:

$$M_i = A_i * (ta)^{k_i} * (i1)^{L_i} \quad \text{[Math. 2]}$$

The polynomial forming the parameter P may thus be written:

$$P = \sum_{i=0}^{H} A_i * (ta)^{k_i} * (i1)^{L_i} \quad \text{[Math. 3]}$$

with the coefficients $k_0, \ldots, K_H$ taking rational values,
the coefficients $L_0, \ldots, L_H$ taking rational values,
and the coefficients $A_i$ taking rational values.

The polynomial making it possible to determine the parameter P comprises, in its most general form, (H+1) monomials.

Among a multitude of studied parameters, the applicant concluded that the polynomial formed from the reaction time ta of the electromagnetic actuator 1 and from the local maximum value i1 of the current in the electromagnetic actuator 1 is the quantity which best accounts for a gradual degradation of this electromagnetic actuator.

The polynomial is a polynomial with two indeterminates, the first indeterminate being the quantity ta and the second indeterminate being the quantity i1.

According to one particular embodiment of the proposed detection process, the parameter P is equal to the product of the determined reaction time ta and of the determined quantity i1 representative of the current circulating in the electromagnetic actuator 1 during the command of the electromagnetic actuator 1.

In other words, in this particular case of implementation of the process, the polynomial P is a monomial, the first power $k_1$ of which is equal to 1 and the second power $L_1$ of which is also equal to 1.

The formed polynomial is then equal to the product of the determined reaction time ta and of the determined quantity i1 representative of the current circulating in the electromagnetic actuator 1 during the command of the electromagnetic actuator 1, that is to say to the result of the multiplication ta*i1 of the value of the determined reaction time ta by the value of the determined quantity i1 representative of the current circulating in the electromagnetic actuator 1 during the command of the electromagnetic actuator 1.

The local maximum value i1 of the current is obtained for an instant t1 between an instant to at which the electrical current starts to circulate in the electromagnetic actuator 1 and an instant tmin corresponding to a local minimum of the electrical current circulating in the electromagnetic actuator 1.

The local maximum value i1 of the electrical current is the value of the electrical current obtained at the passage from the first portion p1 to the second portion p2.

Figure 4:
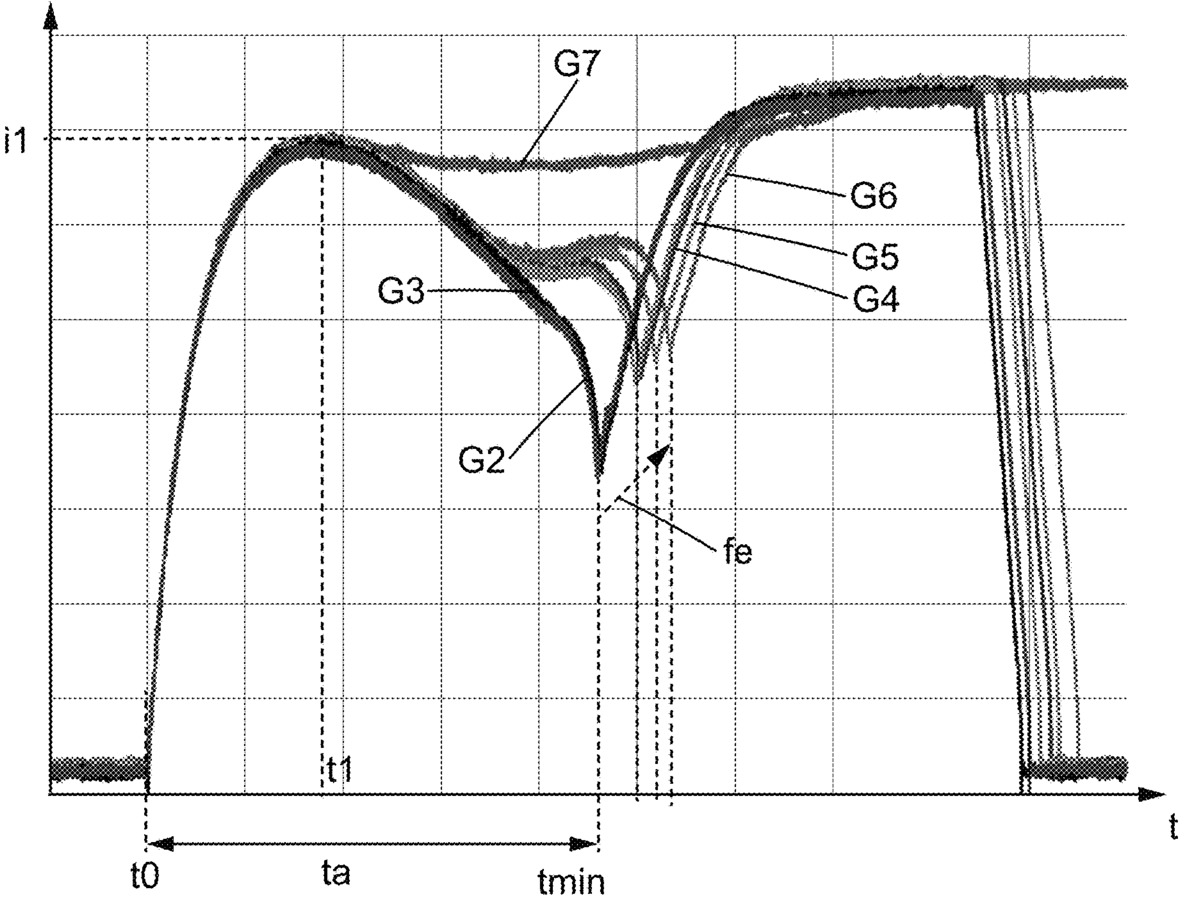
FIG. 4 depicts the evolution of the curve of FIG. 3, in the course of the ageing of the switching device.

FIG. 4 schematically depicts the temporal evolution of the electrical current circulating in the electromagnetic actuator 1 when the latter is commanded, in the course of an accelerated ageing test on a switching device 30.

In particular, FIG. 4 illustrates the evolution of the parameters ta and i1 during this accelerated ageing test. Such a type of test is carried out in conditions which are severe with respect to a normal use of the switching device, with for example a higher temperature and a more corrosive atmosphere than in the normal conditions.

The curve G2 corresponds to the initial state at the start of the test, and the curves G3, G4, . . . , G7 correspond to the state after increasing test times.

The time tmin, corresponding to the end of the movement of the magnetic core 3, shifts little by little towards higher and higher values. The direction of variation is highlighted by the arrow fe. This shift reflects movement of the mechanical parts of the switching device being more and more difficult.

On the curve G7, the electrical current is almost constant, which shows that the magnetic core is almost blocked in its motion. Such a state corresponds to a failure of the switching device.

According to one embodiment of the proposed process, the detection process comprises the substeps:

- calculating a value of a statistical parameter D representative of a fluctuation of the values of the set E of values of the polynomial of the determined reaction time ta and of the predetermined parameter i1,
- determining a degradation of the electromagnetic actuator 1 from the calculated value of the statistical parameter D.

The evolution of the values of the set E in the course of the successive actuations is monitored quantitatively by virtue of the statistical parameter D.

The statistical parameter D representative of a fluctuation of the values of the set E of values of the polynomial of the determined reaction time ta and of the determined quantity i1 comprises a difference d between:

- a current value of the polynomial P of the determined reaction time ta and of the determined quantity i1, determined for a current actuation of the switching device 30, and
- an average value Moy of the values of the polynomial P of the determined reaction time ta and of the determined quantity i1 obtained for a predetermined number M of actuations preceding the current actuation of the switching device 30.

The average value Moy may be a running average calculated from the M values corresponding to the M actuations preceding the current actuation, and comprising a number of values equal to the predetermined number M of actuations. The current actuation is not included in the subset of values taken into account for calculating the average value. This subset comprises M values.

According to one example of an implementation of the detection process, the statistical parameter D representative of a fluctuation of the values of the set E of values of the polynomial of the determined reaction time ta and of the determined quantity i1 comprises a standard deviation of the values of the polynomial of the determined reaction time ta and of the determined quantity i1 determined for a set of actuations of the switching device 30 carried out in reference conditions corresponding to a new condition of the switching device 30.

What is meant by "standard deviation of a set of samples" is the quantity equal to the square root of the variance of this set of samples. The variance is itself defined by the expected value of the square of the deviations from the average, or indeed the root mean square of the deviations between the values of the set of samples and the average of these values.

The set of actuations of the switching device 30 carried out in reference conditions comprises for example 20 successive actuations of the switching device.

The proposed process thus comprises a calibration phase making it possible to quantify the nominal variations in the value of the polynomial of the determined reaction time ta and of the quantity i1 representative of the current circulating in the electromagnetic actuator 1 during the actuation of the switching device 30. These nominal variations correspond to the variations observed in a reference state in which the switching device 30 exhibits no degradation.

The reference state corresponds for example to a new condition of the switching device 30.

What is meant by "new condition" is a period beginning at the first actuation of the switching device, lasting a predetermined maximum time and comprising a predetermined maximum number of actuations. In other words, the new condition corresponds to a time period.

The values acquired in these reference conditions make it possible to determine the nominal variability of the quantity equal to the polynomial of the determined reaction time ta and of the determined quantity i1. This variability is characterized here by the mathematical quantity equal to the standard deviation of the quantity equal to the polynomial of the determined reaction time ta and of the determined quantity i1, determined for the actuations corresponding to the calibration phase.

This variability is characterized from a predetermined number K of values corresponding to a predetermined number of actuations. For example, K=20 successive actuations carried out in the new condition of the switching device may make it possible to characterize the initial variability of the quantity used to determine a degradation of the switching device 30.

The proposed process comprises a measurement phase in which the variations in the value of the polynomial of the determined reaction time ta and of the quantity i1 representative of the current circulating in the electromagnetic actuator 1 are analysed. The measurement phase follows the calibration phase.

The measurement phase is for example carried out throughout the useful life of the switching device 30.

Figure 5:
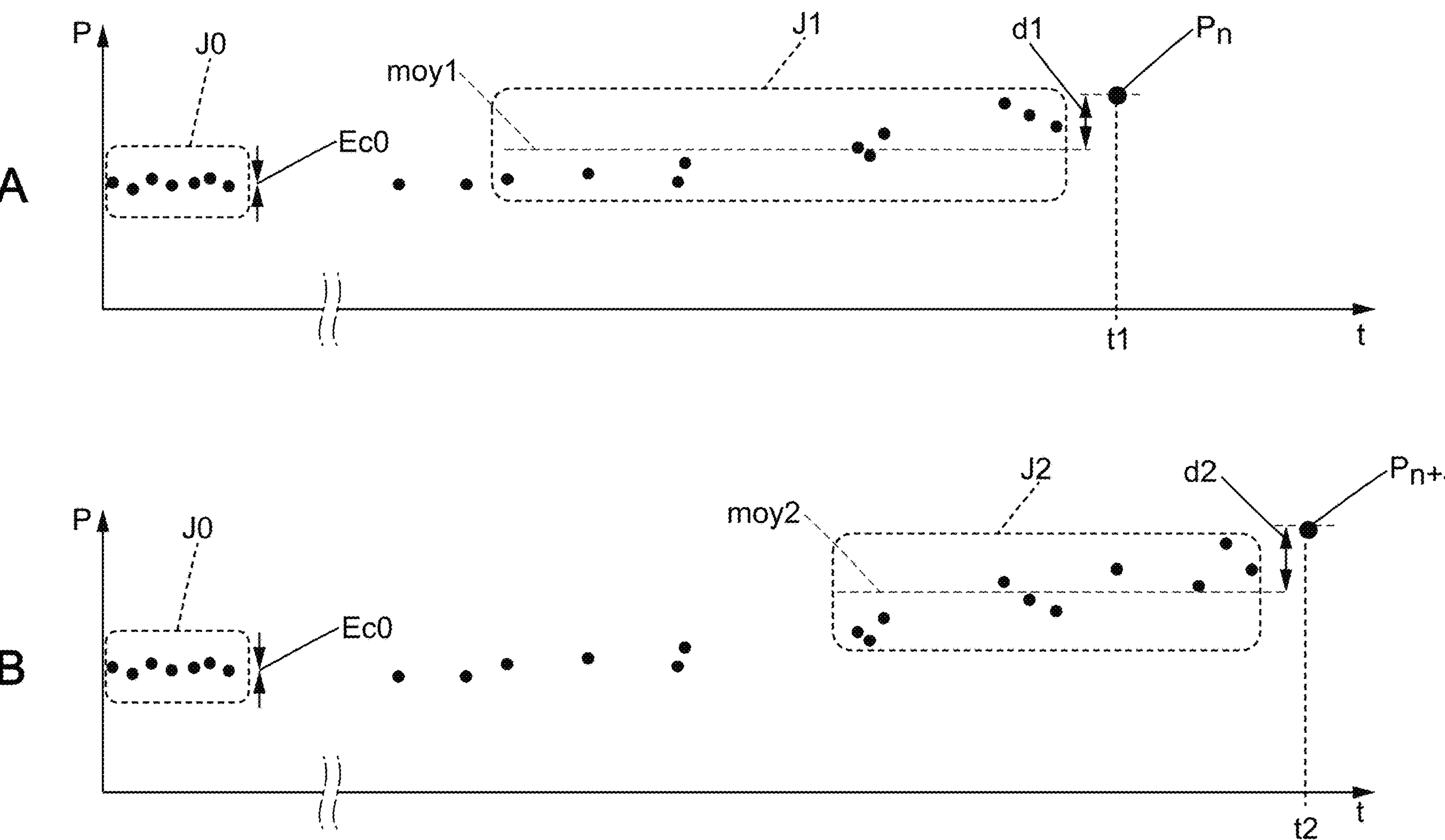
FIG. 5 is a time diagram illustrating the process according to the invention.
Figure 6:
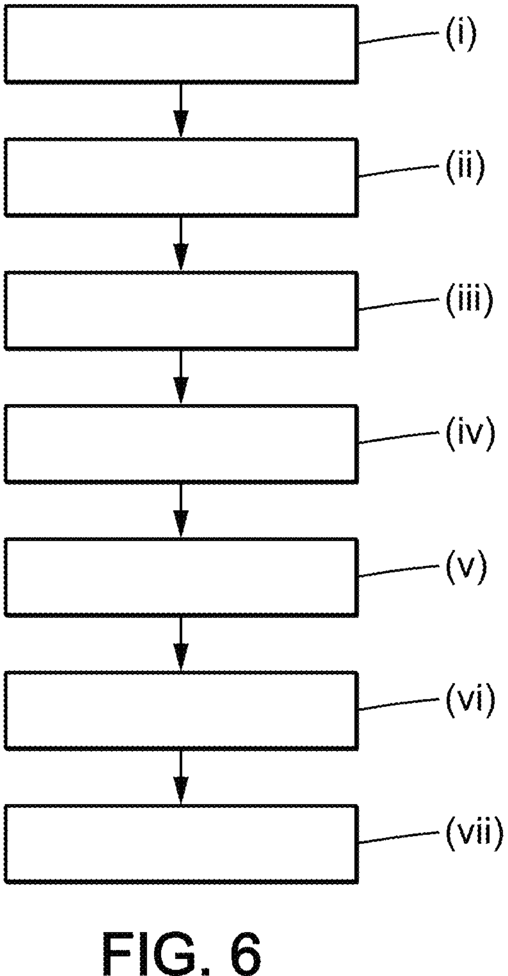
FIG. 6 is a block diagram illustrating various steps of the process according to the invention.

FIG. 5 illustrates the values of the quantity P equal to the polynomial of the determined reaction time ta and of the determined quantity i1, for various actuations. Part A schematically depicts the measurements carried out at a first instant t1. Part B of the figure schematically depicts the measurements carried out at a second instant t2, which is subsequent to t1.

The measurement points framed by the frame designated by J0 are those produced in reference conditions corresponding to a new condition of the switching device 30. In order to simplify the figure, only 7 measurement points are depicted. It may be noted that the dispersion of the values of the quantity P is low.

The reference sign Eco designates the standard deviation of the values corresponding to the set of actuations of the switching device 30 carried out in reference conditions, and taken into account for the calibration phase.

In the depicted example, the values taken into account for the determination of the reference standard deviation correspond to consecutive actuations of the electromagnetic actuator 1. It is also possible for the values not to correspond to consecutive actuations, that is to say that certain actuations may not be taken into account.

In part A of FIG. 5, the measurement points framed by the frame designated by J1 are the points used at the instant t1 for the measurement phase. As above, in order to simplify the figure only 10 measurement points for the quantity P are depicted. The value $P_n$, determined at the time t1, is the current value at the instant t1, that is to say the most recent value, corresponding to the most recent command of the electromagnetic actuator 1.

The dotted horizontal line indicates the average value moy1 of the values taken into account, that is to say those present in the frame J1.

The arrow designated by d1 illustrates the deviation d1 between the current value $P_n$ and the average value moy1 calculated in the example of FIG. 5 over the 10 measurement points preceding the current measurement.

In part B of FIG. 5, the measurement points framed by the frame designated by J2 are the points used at the instant t2 for the measurement phase. As above, 10 measurement points are used in the figure.

The value determined at the time t2 is the current value at the instant t2, that is to say the most recent value. With respect to the instant t1, 4 new measurements have been acquired, and the 4 oldest values from the frame J1 are not used at the instant t2 and do not form part of the frame J2.

The dotted horizontal line indicates the average value moy2 of the values taken into account, that is to say those present in the frame J2.

The arrow designated by d2 illustrates the deviation d2 between the current value $P_{n+4}$ and the average value moy2.

According to one embodiment of the detection process, the statistical parameter D representative of a fluctuation of the polynomial of the determined reaction time ta and of the determined quantity i1 is equal to the ratio of:

- the difference d between a current value of the polynomial P determined for a current actuation and the average value Moy of the values of the polynomial P obtained for a predetermined number M of actuations preceding the current actuation, and
- the determined standard deviation of the values of the polynomial of the determined reaction time ta and of the determined quantity i1, determined for a set of actuations of the switching device 30 carried out in reference conditions corresponding to a new condition of the switching device 30.

The proposed statistical parameter D makes robust detection of degradation of the electromagnetic actuator 1 possible, while at the same time being simple to implement. In particular, the necessary calculations may easily be carried out in real time, which makes detection, also in real time, of the presence of a degradation possible.

The statistical parameter D representative of a fluctuation of the polynomial of the determined reaction time ta and of the determined quantity i1 is thus equal, for a measurement of rank i, to:

$$D_i = \frac{P_i - \frac{\sum_{j=i-M-1}^{j=i-1} P_j}{M}}{\sqrt{\sum_{j=1}^{K} \frac{\left(P_j - \frac{\sum_{j=1}^{j=K} P_j}{K}\right)^2}{K}}} \quad \text{[Math. 1]}$$

with $P_i$ being the determined value of the polynomial P for an actuation of rank i, $D_i$ the calculated value of the statistical parameter D for the actuation of rank i, M the number of actuations taken into account for the determination of the average value, K is a number of actuations carried out in reference conditions corresponding to a new condition of the switching device 30. That is to say that K is the number of actuations taken into account for the initial calibration.

A degradation of the electromagnetic actuator 1 is determined when the absolute value of the statistical parameter D representative of a fluctuation of the polynomial of the determined reaction time ta and of the determined quantity i1 is above a first positive predetermined threshold S1.

By definition, the absolute value of a given number is its numerical value without taking account of its sign.

If a number is positive, its absolute value is thus equal to this number.

If a number is negative, its absolute value is equal to the opposite of this number.

A degradation is said to be determined when degradation is detected.

The value chosen for the first positive predetermined threshold S1 makes it possible to adjust the sensitivity of the proposed detection process.

The first positive predetermined threshold S1 is for example between 2 and 3.

The closer the chosen threshold is to 1, the more sensitive the fault detection will be, that is to say that a small deviation with respect to the reference conditions will be interpreted as the appearance of a degradation.

Conversely, an absence of degradation of the electromagnetic actuator 1 is determined when the absolute value of the statistical parameter D representative of a fluctuation of the polynomial of the determined reaction time ta and of the determined quantity i1 is below or equal to the first positive predetermined threshold S1.

A small value of the absolute value of the statistical parameter D, indicating a small deviation between the current behaviour of the electromagnetic actuator 1 and its behaviour in the new condition, indicates an operational status close to the new condition. An absence of degradation may thus be confirmed.

According to one example of an embodiment of the detection process, the degradation of the electromagnetic actuator 1 is classified as a first type of degradation, referred to as minor degradation, when the absolute value of the statistical parameter D representative of a fluctuation of the polynomial of the determined reaction time ta and of the determined quantity i1 is above a first positive predetermined threshold S1 and below a second positive predetermined threshold S2.

The second positive predetermined threshold S2 is for example between 4 and 5.

According to one example of an embodiment of the detection process, the degradation of the electromagnetic actuator 1 is classified as a second type of degradation, referred to as major degradation, when the absolute value of the statistical parameter D representative of a fluctuation of the polynomial of the determined reaction time ta and of the determined quantity i1 is above the second positive predetermined threshold S2.

It will be noted that the proposed process may be implemented without calculating the absolute value of the statistical parameter D directly. Specifically, the determined value of the statistical parameter D may be compared, on the one hand, to the threshold values S1, S2, which are positive, and on the other hand to the opposite −S1, −S2 of these threshold values. A possible degradation may be determined on the basis of this double comparison.

The used statistical parameter D thus makes it possible to quantify the severity of the degradation, and not only to determine the presence or the absence of a degradation. The operators of the electrical circuit 50 on which the switching device is used may thus monitor the evolution of the device over the course of time, and react accordingly.

The detection process may comprise a step of transmitting an alarm signal in response to a determination of a degradation of the electromagnetic actuator 1.

The alarm signal may be for example a code stored in an electronic control unit. As a variant or additionally, the alarm signal may be an activation of a warning light.

As another variant or in addition, the alarm signal may be a displaying of a message on a monitor.

Other types of alarm are of course possible.

The transmitted alarm signal may be different when the detected degradation is a degradation referred to as minor and when the detected degradation is a degradation referred to as major.

The transmitted alarm signal makes it possible for users to plan and to carry out an operation of maintaining or of replacing the degraded switching device, in order to correct the diagnosed problem.

No alarm signal is transmitted when no degradation has been determined. In other words, no alarm is transmitted when the proposed process indicates that the electromagnetic actuator 1 is free from degradation.

The invention claimed is:

1. A process for detecting degradation of a switching device comprising an electromagnetic actuator configured to unlock a control mechanism, the control mechanism comprising an elastic member configured to move an electrical contact to open or close an electrical circuit, the process comprising:

commanding the electromagnetic actuator;

measuring an electrical current circulating in the electromagnetic actuator during the command of the electromagnetic actuator;

determining, from the measured electrical current, a reaction time of the electromagnetic actuator and a quantity representative of the electrical current circulating in the electromagnetic actuator during the command of the electromagnetic actuator;

determining a parameter in a form of a polynomial of the reaction time and of the quantity representative of the electrical current circulating in the electromagnetic actuator during the command of the electromagnetic actuator, the parameter being written:

$$P = \sum_{i=0}^{H} A_i * (ta)^{k_i} * (i1)^{L_i}$$

wherein ta represents the reaction time, i1 represents the quantity, $k_0, \ldots, k_H$ have rational values, coefficients $L_0, \ldots, L_H$ have rational values, a coefficient $A_i$ has a rational value, and H is a positive integer;

iterating the commanding, the measuring, the determining of the reaction time and the quantity, and the determining of the parameter for a set of successive commands of the electromagnetic actuator to obtain a set of values of the parameter;

determining a degradation of the electromagnetic actuator from an evolution of values of the set of values during successive commands of the electromagnetic actuator;

displaying an alarm signal as a message on a monitor to indicate the degradation of the electromagnetic actuator in response to the determination of the degradation; and maintaining or replacing the switching device based on the alarm signal.

2. The detection process according to claim 1, wherein the switching device comprises:

the electrical contact which is mobile between an opening position for opening the electrical circuit and a closing position for closing the electrical circuit;

the control mechanism, comprising:

the elastic member configured to move the electrical contact from the closing position to the opening position or from the opening position to the closing position to open or close the electrical circuit, respectively; and an unlocking member configured to pass from a locking position in which the elastic member is kept in a state of tension to a freeing position in which the elastic member is free to relax to move the electrical contact from the closing position to the opening position or from the opening position to the closing position; and the electromagnetic actuator configured to move the unlocking member from the locking position to the freeing position.

3. The detection process according to claim 1, wherein the parameter is equal to a product of the reaction time and the quantity representative of the electrical current circulating in the electromagnetic actuator during the command of the electromagnetic actuator.

4. The detection process according to claim 1, wherein the reaction time is determined from temporal variations in the electrical current.

5. The detection process according to claim 1, wherein the reaction time is equal to a time elapsed between an instant at which the electrical current starts to circulate in the electromagnetic actuator and an instant corresponding to a local minimum value of the electrical current.

6. The detection process according to claim 1, wherein the quantity is a local maximum value of the electrical current.

7. The detection process according to claim 1, further comprising:

calculating a value of a statistical parameter representative of a fluctuation of the values of the set of values of the polynomial; and determining the degradation of the electromagnetic actuator from the calculated value of the statistical parameter.

8. The detection process according to claim 7, wherein the statistical parameter comprises a difference between:

a current value of the polynomial, determined for a current actuation of the switching device, and an average value of the values of the polynomial obtained for a predetermined number of actuations preceding the current actuation of the switching device.

9. The detection process according to claim 7, wherein the statistical parameter comprises a standard deviation of the values of the polynomial determined for a set of actuations of the switching device carried out in reference conditions corresponding to a new condition of the switching device.

10. The detection process according to claim 7, wherein the statistical parameter is equal to a ratio of:

a difference between a current value of the polynomial determined for a current actuation and an average value of the values of the polynomial obtained for a predetermined number of actuations preceding the current actuation, and a determined standard deviation of the values of the polynomial determined for a set of actuations of the switching device carried out in reference conditions corresponding to a new condition of the switching device.

11. The detection process according to claim 7, wherein the statistical parameter is equal to:

$$D_i = \frac{P_i - \frac{\sum_{j=i-M-1}^{j=i-1} P_j}{M}}{\sqrt{\sum_{j=1}^{K}\left(\frac{P_j - \frac{\sum_{j=1}^{j=K} P_j}{K}}{K}\right)^2}}$$

wherein $P_i$ being represents the value of the polynomial determined for an actuation of rank i, Di represents the value of the statistical parameter calculated for the actuation of rank i, M represents a number of actuations considered to determine an average value, and K represents a number of actuations carried out in reference conditions corresponding to a new condition of the switching device.

12. The detection process according to claim 7, wherein the degradation of the electromagnetic actuator is determined when an absolute value of the statistical parameter is above a first positive predetermined threshold.

13. The detection process according to claim 12, wherein the degradation of the electromagnetic actuator is classified as a first type of degradation when the absolute value of the statistical parameter is above the first positive predetermined threshold and below a second positive predetermined threshold.

14. The detection process according to claim 12, wherein the degradation of the electromagnetic actuator is classified as a second type of fault when the absolute value of the statistical parameter is above a second positive predetermined threshold.

15. The detection process according to claim 1, further comprising: transmitting the alarm signal in response to the determination of the degradation of the electromagnetic actuator.

16. A switching device comprising:

an electromagnetic actuator configured to unlock a control mechanism, the control mechanism comprising an elastic member configured to move an electrical contact to open or close an electrical circuit; and an electronic control unit configured to implement the process for detecting degradation according to claim 1, wherein the switching device is a circuit breaker, a switch, or a disconnector.

17. The switching device according to claim 16, further comprising:

the electrical contact which is mobile between an opening position for opening the electrical circuit and a closing position for closing the electrical circuit;

the control mechanism comprising:

the elastic member configured to move the electrical contact from the closing position to the opening position or from the opening position to the closing position to open or close the electrical circuit, respectively; and an unlocking member configured to pass from a locking position in which the elastic member is kept in a state of tension to a freeing position in which the elastic member is free to relax to move the electrical contact from the closing position to the opening position or from the opening position to the closing position; and the electromagnetic actuator configured to move the unlocking member from the locking position to the freeing position.

18. The switching device according to claim 16, wherein the parameter is equal to a product of the reaction time and the quantity representative of the electrical current circulating in the electromagnetic actuator during the command of the electromagnetic actuator.

19. The switching device according to claim 16, wherein the reaction time is determined from temporal variations in the electrical current.

20. The switching device according to claim 16, wherein the reaction time is equal to a time elapsed between an instant at which the electrical current starts to circulate in the electromagnetic actuator and an instant corresponding to a local minimum value of the electrical current.

* * * * *